(12) United States Patent
Haessig, Jr. et al.

(10) Patent No.: US 10,425,096 B1
(45) Date of Patent: Sep. 24, 2019

(54) METHOD AND APPARATUS FOR IMPROVING RESOLUTIONS OF ANALOG-TO-DIGITAL CONVERTERS

(71) Applicant: BAE SYSTEMS INFORMATION AND ELECTRONIC SYSTEMS INTEGRATION INC., Nashua, NH (US)

(72) Inventors: David A. Haessig, Jr., Towaco, NJ (US); Amod V. Dandawate, Basking Ridge, NJ (US); David C. Donarski, Manassas, VA (US); Dale A. Rickard, Bedford, MA (US); Forrest C. Vatter, Bedford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/981,210

(22) Filed: May 16, 2018

(51) Int. Cl.
*H03M 1/00* (2006.01)
*H03M 1/20* (2006.01)
*H03M 1/12* (2006.01)

(52) U.S. Cl.
CPC ......... *H03M 1/201* (2013.01); *H03M 1/1245* (2013.01)

(58) Field of Classification Search
CPC .............................. H03M 1/201; H03M 1/1245
USPC .......................... 341/143, 144, 155, 122, 110
See application file for complete search history.

(56) References Cited

U.S. PATENT DOCUMENTS

2014/0117955 A1* 5/2014 Zoso ..................... H02M 3/157
323/271

\* cited by examiner

*Primary Examiner* — Peguy Jean Pierre
(74) *Attorney, Agent, or Firm* — Antony P. Ng; Russell Ng PLLC

(57) ABSTRACT

An apparatus having an analog-to-digital converter with an increased effective resolution is disclosed. The apparatus includes a signal processing functional block and an analog-to-digital conversion block. The signal processing functional block includes a controller for providing a set of digital control signals according to a set of digital input signals received by the controller, a digital-to-analog converter for converting the digital control signals to a set of corresponding analog control signals, and a physical hardware unit for performing a specific function according to the analog control signals. The analog-to-digital conversion block includes an adder for adding a dither signal to an analog feedback signal originated from the physical hardware unit, an ADC for converting sums of dither signals and analog feedback signals to a set of oversampled digital control signals to be fed into the controller.

15 Claims, 3 Drawing Sheets

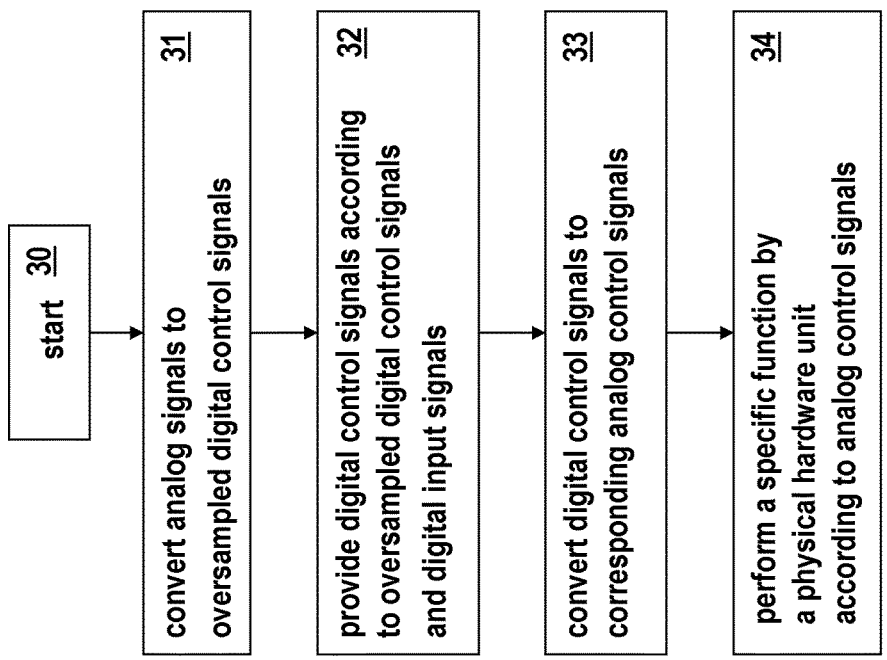

METHOD AND APPARATUS FOR IMPROVING RESOLUTIONS OF ANALOG-TO-DIGITAL CONVERTERS

TECHNICAL FIELD

The present invention relates to analog-to-digital converters in general, and in particular to a method and apparatus for improving the effective resolutions of analog-to-digital converters.

BACKGROUND

An analog-to-digital converter (ADC) is an electronic device that converts analog signals to digital signals. In essence, an ADC converts an analog voltage or current input to a digital number representing the magnitude of the voltage or current input. The digital output is typically a two's complement binary number that is proportional to the voltage or current input.

The resolution of an ADC indicates the number of discrete values it can produce over the range of analog values. The resolution determines the magnitude of the quantization error, and thus dictates the maximum possible average signal-to-noise ratio for an ideal ADC without the use of oversampling (i.e., sampling at a higher rate). The values are usually stored electronically in binary form. As such, the resolution is typically expressed in number of bits, and the number of discrete values (or levels) available within an ADC is assumed to be in a power of two. An ADC with a resolution of, for example, 8 bits can encode an analog input to one in $2^8=256$ different discrete values (or levels). The discrete values can represent the ranges from 0 to 255 (as unsigned integers) or from −128 to 127 (as signed integers), depending on the application.

An ADC typically provides a quantization step size that is several times smaller than the accuracy required in the physical value that is being measured through that ADC. With oversampling and filtering, it is possible to improve the resolution of the measurement at the output of the filter, thereby increasing the effective number of bits of the ADC.

The present disclosure provides an improved method and apparatus for increasing the effective resolutions of ADCs.

SUMMARY

In accordance with one embodiment of the present disclosure, an apparatus having an ADC with an increased effective resolution includes a signal processing functional block and an analog-to-digital conversion block. The signal processing functional block includes a controller for providing a set of digital control signals according to a set of digital input signals received by the controller, a digital-to-analog converter for converting the digital control signals to a set of corresponding analog control signals, and a physical hardware unit for performing a specific function according to the analog control signals. The analog-to-digital conversion block includes an adder for adding a dither signal to an analog feedback signal originated from the physical hardware unit, an ADC for converting sums of dither signals and analog feedback signals to a set of oversampled digital control signals to be fed into the controller.

The features and advantages described herein are not all-inclusive and, in particular, many additional features and advantages will be apparent to one of ordinary skill in the art in view of the drawings, specification and claims. Moreover, it should be noted that the language used in the specification has been selected principally for readability and instructional purposes and not to limit the scope of the inventive subject matter.

BRIEF DESCRIPTION OF THE DRAWINGS

The invention itself, as well as its modes of use, further objects, and advantages thereof, will best be understood by reference to the following detailed description of an illustrative embodiment when read in conjunction with the accompanying drawings, wherein:

FIG. 3 is a logic flow diagram of a method for increasing an effective resolution of an ADC, according to one embodiment.

DETAILED DESCRIPTION

Figure 1:
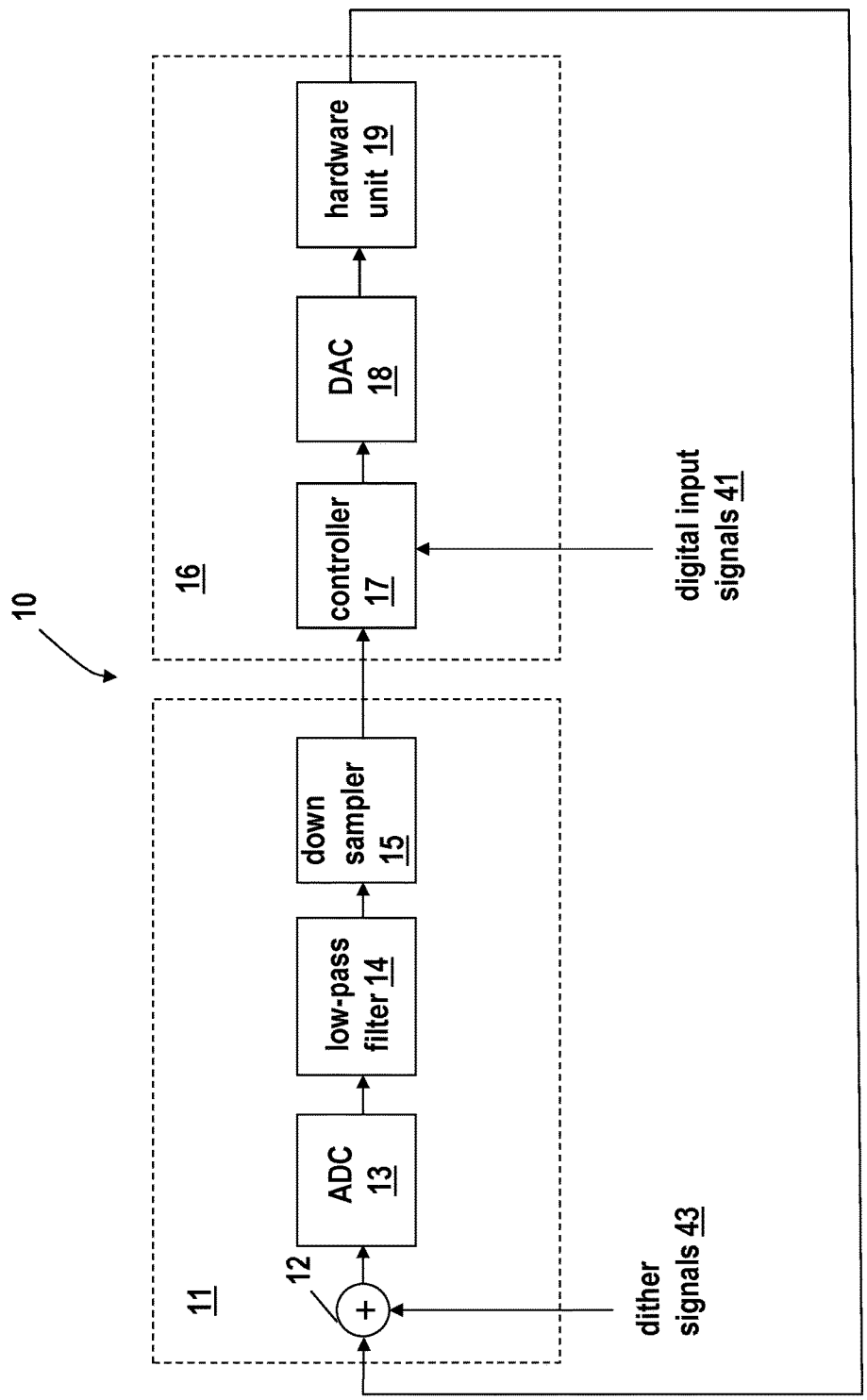
FIG. 1 is a block diagram of a mixed signal system having an apparatus for increasing the effective resolution of an ADC, according to the prior art.

Referring now to the drawings and in particular to FIG. 1, there is depicted a block diagram of a mixed signal system having an apparatus for increasing the effective resolution of an ADC, according to the prior art. As shown, a system 10 includes an analog-to-digital conversion block 11 coupled to a signal processing functional block 16. Analog-to-digital conversion block 11 includes an adder 12, an N-bit ADC 13, a low-pass filter 14 and a down-sampler 15. ADC 13 may have an effective number of bits of less than N. In fact, the effective number of bits of ADC 13 is often less than N due to internal error and noise within ADC 13. Signal processing functional block 16 includes a controller 17, a digital-to-analog converter (DAC) 18 and a physical hardware unit 19. Physical hardware unit 19 can be various types of hardware depending on the applications.

The various functionalities of physical hardware unit 19 can be controlled by digital input signals 41 via controller 17. Controller 17 converts the digital input signals 41 to a set of digital control signals. In turn, the digital control signals from controller 17 are converted to corresponding analog signals via DAC 18 for controlling physical hardware unit 19. Analog feedback signals 42 from physical hardware unit 19 are fed back to analog-to-digital conversion block 11 in which dither signals 43 are added to analog feedback signals 42 via adder 12. Dither signals 43 can be, for example, Gaussian or uniformly distributed random noise added to analog feedback signals 42 in order to avoid analog feedback signals 42 from being settled on one quantization level of ADC 13. The sum of analog feedback signals 42 and dither signals 43 enters ADC 13 in which the signals are sampled at a sampling frequency $f_s$ via a sample-and-hold circuit (not shown) within ADC 13.

One conventional technique for increasing the effective number of bits of ADC 13 is by increasing the sampling frequency $f_s$ of the sample-and-hold circuit within ADC 13 via oversampling. For example, if the Nyquist frequency of the analog signals entering the sample-and-hold circuit within ADC 13 is, for example, 100 KHz, then the sampling frequency $f_s$ can be set at, for example, 1 MHz. Afterwards, the oversampled digital signals from ADC 13 are then sent to low-pass filter 14 to remove some of the unwanted noise in order to enhance the resolution of the oversampled digital signals. Down-sampler 15 is then utilized to down-sample the filtered oversampled digital signals. For the above-mentioned 1 MHz oversampled digital signals example, down-sampler 15 will discard all but every $10^{th}$ sample. This requires analog feedback signals 42 to contain a noise source, such as dither signals 43, that dithers analog feedback signals 42 over several quantization steps.

Figure 2:
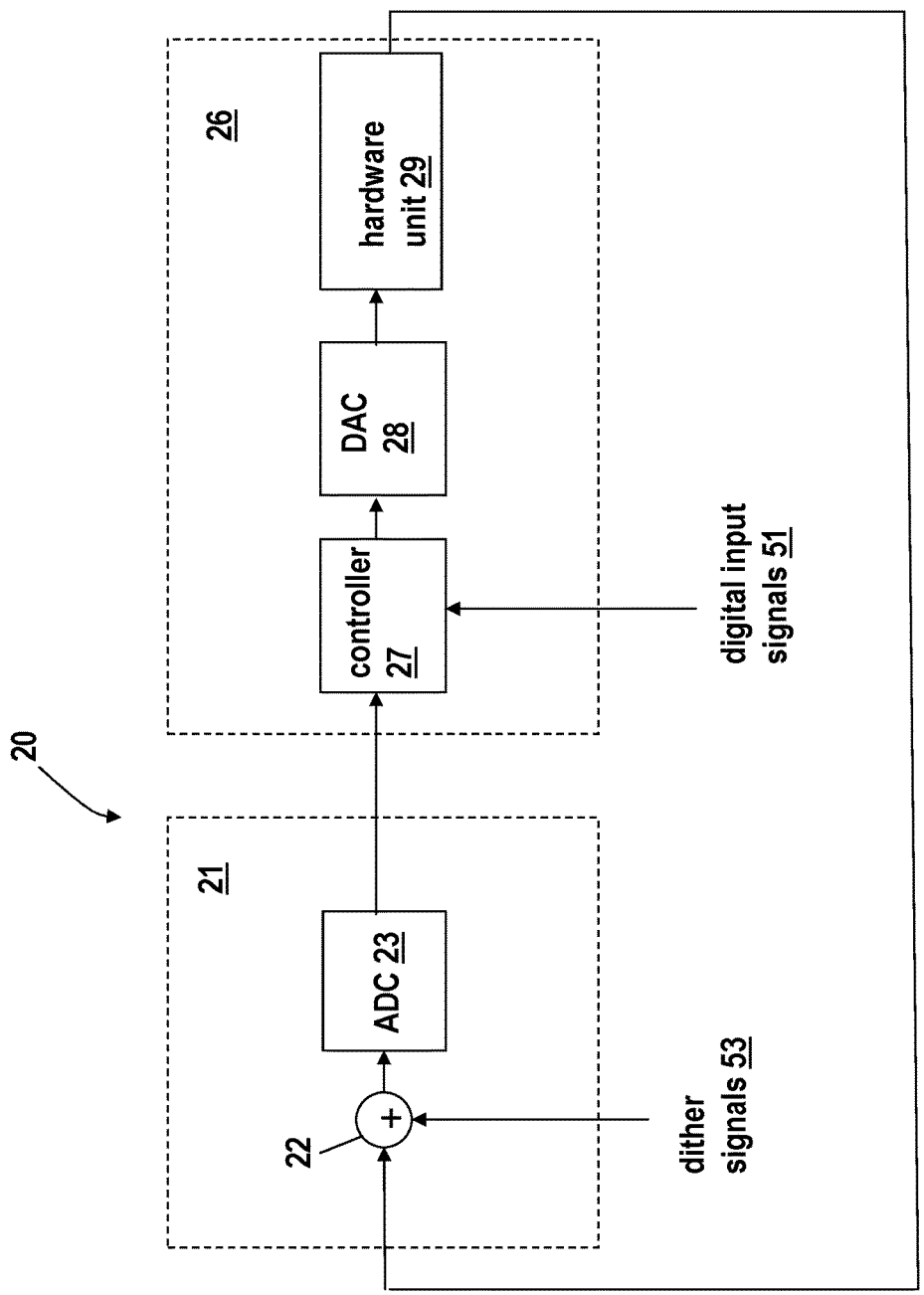
FIG. 2 is a block diagram of a mixed signal system having an apparatus for increasing the effective resolution of an ADC, according to one embodiment.

With reference now to FIG. 2, there is depicted a block diagram of a mixed signal system having an apparatus for increasing the effective resolution of an ADC, according to one embodiment. As shown, a system 20 includes an analog-to-digital conversion block 21 coupled to a signal processing functional block 26. Analog-to-digital conversion block 21 includes an adder 22 and an N-bit ADC 23. Similar to N-bit ADC 13 in FIG. 1, the effective number of bits of ADC 23 is often less than N due to internal error and noise within ADC 23. Signal processing functional block 26 includes a controller 27, a DAC 28 and a physical hardware unit 29. Physical hardware unit 29 can be various types of hardware depending on the applications, which include, but not limited to, antenna arrays, robotics, turbines, engines, etc.

The various functionalities of physical hardware unit 29 can be controlled by digital input signals 51 via controller 27. Controller 27 converts digital input signals 51 to a set of digital control signals, and DAC 28 converts the digital control signals from controller 27 to corresponding analog signals for controlling physical hardware unit 29. Analog feedback signals 52 from physical hardware unit 29 are fed back to analog-to-digital conversion block 21 in which dither signals 53 are added to analog feedback signals 52 via adder 22. Analog feedback signals 52 can be a single wire or multiple wires. Similarly, dither signals 53 can be a single wire or multiple wires. Dither signals 53 can be, for example, Gaussian or uniformly distributed random noise added to analog feedback signals 52 in order to avoid analog feedback signals 52 from being settled on one quantization level of ADC 23. The sum of analog feedback signals 52 and dither signals 53 enters ADC 23 in which the signals are sampled at a sampling frequency $f_s$ via a sample-and-hold circuit (not shown) within ADC 23. The oversampled digital signals from ADC 23 are directly sent to controller 27 without filtering and downsampling (as shown in FIG. 1).

Controller 17 and DAC 18 from FIG. 1 run at a frequency that is dictated by down-sampler 15 (such as one tenth lower than sampling frequency $f_s$ in the above-mentioned example). On the other hand, controller 27 and DAC 28 from FIG. 2 run at a frequency identical to sampling frequency $f_s$. Executions of controller 27 and DAC 28 at sample frequency $f_s$ allow more signal content and wider signal bandwidth to be sent to hardware unit 29. Hardware unit 29 has a natural frequency response that results in a natural low-pass filtering on the signal passing through it. Basically, hardware unit 29 performs active low-pass filtering on the digital samples received from ADC 23.

Hence, low-pass filter 14 and down-sampler 15 that are required in analog-to-digital conversion block 11 of FIG. 1 can be eliminated from analog-to-digital conversion block 21 of the present embodiment. This is based on the premise that in a control system involving a physical system, such as physical hardware unit 29, the low frequency characteristics of the physical system itself can be utilized as the filtering agent, allowing the unfiltered oversampled data from ADC 23 to be processed directly. In the case of a control system, this processing can be performed by controller 27 and DAC 28. As a result, system 20 requires less hardware than system 10 from FIG. 1 for performing identical functions.

The governing equations of controller 27 should be similar or identical to those of controller 17 with the time-step dependent coefficients scaled for consistency with the shorter time-step being applied in controller 17 and control system 16. The lack of a dedicated low-pass filter (such as low-pass filter 14 from FIG. 1) and a dedicated down-sampler (such as down-sampler 15 from FIG. 1) in analog-to-digital conversion block 21 and/or signal processing functional block 26 along with an increased operating frequency of controller 27 and DAC 28 reduce the time-delay and phase loss caused by sampling. They also reduce the associated time delay and phase loss by a factor equaling the down sample factor. As a result, the stability margins of signal processing functional block 26 are improved, which makes signal processing functional block 26 and closed-loop system 20 in general less likely to become unstable.

System 20 may include multiple analog-to-digital conversion blocks 21, each receiving one analog feedback signal 52, controller 27 having multiple inputs and outputs and multiple digital-to-analog converters 28. In this alternative embodiment, hardware unit 29 will include multiple inputs accordingly.

Referring now FIG. 3, there is depicted a logic flow diagram of a method for increasing an effective resolution of an ADC, according to one embodiment. Starting at block 30, a set of analog signals is converted by an ADC (such as ADC 23 from FIG. 2) to a set of oversampled digital control signals, as shown in block 31. A controller (such as controller 27 from FIG. 2) then generates a set of digital control signals according to the oversampled digital control signals and a set of digital input signals (such as digital input signals 51 from FIG. 2) received by the controller, as depicted in block 32. The operating frequency of the controller is identical to the sampling frequency of the ADC. Next, the digital control signals are converted to a set of corresponding analog control signals by a DAC (such as DAC 28 from FIG. 2), as shown in block 33. The operating frequency of the DAC is identical to the sampling frequency of the ADC. A physical hardware unit (such as physical hardware unit 29 from FIG. 2) subsequently performs a specific function according to the analog control signals, as depicted in block 34.

As has been described, the present disclosure provides an improved method and apparatus for increasing the effective resolutions of ADCs. By taking advantage of the low-pass filtering effect that is naturally provided by the physical system being controlled, dedicated low-pass filters can be eliminated from a system. The output of the control system is being measured and sampled through the ADC. In some cases, dithering of the analog feedback input to the ADC is required to cause the input to have excursions that exceed several bit transitions. In cases having sufficient additive noise at the analog feedback input, addition of analog dither is not needed either. The improved ADC resolution can be achieved with a reduction in time delay due to the elimination of the down sampling and lower frequency, which improves control system stability characteristics.

While the invention has been particularly shown and described with reference to a preferred embodiment, it will be understood by those skilled in the art that various changes in form and detail may be made therein without departing from the spirit and scope of the invention.

What is claimed is:
1. An apparatus comprising:
   a signal processing functional block includes
      a controller to provide a plurality of digital control signals based on a plurality of oversampled digital control signals and a plurality of digital input signals received by said controller;

a digital-to-analog converter (DAC) to convert said digital control signals to a plurality of corresponding analog control signals; and a physical hardware unit to perform a specific function according to said analog control signals; and an analog-to-digital conversion block includes an adder to add a dither signal to an analog feedback signal originated from said physical hardware unit; and an analog-to-digital converter (ADC) to convert sums of said analog feedback signal and said dither signal to said plurality of oversampled digital control signals fed to said controller, wherein said controller is directly connected to said ADC having a sampling frequency substantially identical to operating frequencies of said controller and said DAC.

2. The apparatus of claim 1, wherein said ADC includes a sample-and-hold circuit to perform oversampling of said sums of said analog feedback signal and said dither signal.

3. The apparatus of claim 1, wherein said dither signal is Gaussian noise.

4. The apparatus of claim 1, wherein said dither signal is uniformly distributed random noise.

5. The apparatus of claim 1, wherein said analog-to-digital conversion block processes said oversampled digital control signal to be fed to said controller without utilizing a low-pass filter.

6. The apparatus of claim 1, wherein said analog-to-digital conversion block processes said oversampled digital control signals to be fed to said controller without utilizing a down sampler.

7. The apparatus of claim 1, wherein said physical hardware unit performs low-pass filtering via a natural frequency response.

8. The apparatus of claim 1, wherein said physical hardware unit is an antenna array.

9. A method for increasing an effective resolution of an analog-to-digital converter (ADC), said method comprising:

converting a set of analog signals by said ADC to a plurality of oversampled digital control signals;

providing a plurality of digital control signals by a controller based on said oversampled digital control signals and a plurality of digital input signals received by said controller, wherein an operating frequency of said controller is identical to a sampling frequency of said ADC;

converting said digital control signals by a digital-to-analog converter (DAC) to a plurality of corresponding analog control signals, wherein an operating frequency of said DAC is identical to said sampling frequency of said ADC; and performing a specific function by a physical hardware unit according to said analog control signals.

10. The method of claim 9, wherein said set of analog signals includes a sum of an analog feedback signal from said physical hardware unit and a dither signal.

11. The method of claim 10, wherein said method further includes oversampling said sum of said analog feedback signal and said dither signal by a sample-and-hold circuit within said ADC.

12. The method of claim 9, wherein said dither signal is Gaussian noise.

13. The method of claim 9, wherein said dither signal is uniformly distributed random noise.

14. The method of claim 9, wherein said oversampled digital control signals to be fed to said controller are provided without utilizing a low-pass filter.

15. The method of claim 9, wherein said oversampled digital control signals to be fed to said controller are provided without utilizing a down sampler.

\* \* \* \* \*